United States Patent
Richter et al.

(10) Patent No.: US 11,892,517 B2
(45) Date of Patent: Feb. 6, 2024

(54) METHOD FOR DETERMINING A STATE VALUE OF A TRACTION BATTERY

(71) Applicant: DEKRA SE, Stuttgart (DE)

(72) Inventors: Andreas Richter, Stuttgart (DE); Christoph Häußler, Stuttgart (DE); Kim Von Grabe, Böblingen (DE); Hans-Jürgen Mäurer, Stuttgart (DE); Simon Tilgner, Schlaitdorf (DE)

(73) Assignee: DEKRA SE, Stuttgart (DE)

( * ) Notice: Subject to any disclaimer, the term of this patent is extended or adjusted under 35 U.S.C. 154(b) by 0 days.

(21) Appl. No.: 17/778,334

(22) PCT Filed: Nov. 3, 2020

(86) PCT No.: PCT/EP2020/080761
§ 371 (c)(1),
(2) Date: May 19, 2022

(87) PCT Pub. No.: WO2021/099102
PCT Pub. Date: May 27, 2021

(65) Prior Publication Data
US 2023/0152385 A1    May 18, 2023

(30) Foreign Application Priority Data
Nov. 20, 2019 (DE) .......................... 102019131283.3

(51) Int. Cl.
*G01R 31/392* (2019.01)
*G01R 31/389* (2019.01)
(Continued)

(52) U.S. Cl.
CPC ............ *G01R 31/392* (2019.01); *B60L 50/60* (2019.02); *G01R 31/367* (2019.01);
(Continued)

(58) Field of Classification Search
None
See application file for complete search history.

(56) References Cited

U.S. PATENT DOCUMENTS

| 6,307,377 B1 * | 10/2001 | Cummings | .......... G01R 31/396 |
| | | | 324/427 |
| 2012/0215472 A1 * | 8/2012 | Tezuka | ................. G01R 31/387 |
| | | | 702/63 |

(Continued)

FOREIGN PATENT DOCUMENTS

| DE | 10328721 A1 | 1/2005 |
| DE | 102014220914 A1 | 4/2016 |

(Continued)

OTHER PUBLICATIONS

International Search Report dated Feb. 8, 2021; International Application No. PCT/EP2020/080761.

*Primary Examiner* — Jas A Sanghera
(74) *Attorney, Agent, or Firm* — DINSMORE & SHOHL LLP

(57) ABSTRACT

A method for determining a state value of a traction battery of an electric vehicle characterises the ageing state, preferably an SoH value. The traction battery is charged or discharged by a test load and a respective output voltage and load current value pair is acquired. An ohmic internal resistance is established on the basis of the acquired value pair. The state value is established on the basis of the established ohmic internal resistance. At least one normalisation variable characterizing the traction battery is established. On the basis of the established ohmic internal resistance and the normalisation variable, a normalised internal resistance based on a reference value of the normalisation variable is established. The state value is established on the basis of the normalised internal resistance. A diagnostics device has an evaluation unit which is directly or indirectly couplable to the traction battery and carries out the method.

13 Claims, 9 Drawing Sheets

(51) Int. Cl.
  *G01R 31/3842* (2019.01)
  *G01R 31/367* (2019.01)
  *G01R 31/374* (2019.01)
  *B60L 50/60* (2019.01)

(52) U.S. Cl.
  CPC ......... *G01R 31/374* (2019.01); *G01R 31/389* (2019.01); *G01R 31/3842* (2019.01)

(56) References Cited

U.S. PATENT DOCUMENTS

| | | | |
|---|---|---|---|
| 2012/0310565 A1 | 12/2012 | Redey | |
| 2013/0234672 A1* | 9/2013 | Kubota | G01R 31/3835 320/134 |
| 2013/0325379 A1* | 12/2013 | Nakamura | G01R 31/3835 702/63 |
| 2014/0095090 A1* | 4/2014 | Chen | G01R 31/3828 702/63 |
| 2016/0109526 A1* | 4/2016 | Geffin | G01R 31/3648 702/189 |

FOREIGN PATENT DOCUMENTS

| | | |
|---|---|---|
| EP | 1251359 A1 | 10/2002 |
| EP | 3812781 A1 | 4/2021 |
| JP | 2017099221 A | 6/2017 |
| WO | 8302005 A1 | 6/1983 |

* cited by examiner

- ● I / [A]
- ○ U / [V]

METHOD FOR DETERMINING A STATE VALUE OF A TRACTION BATTERY

CROSS-REFERENCE TO RELATED APPLICATIONS

This application is the U.S. National Stage of PCT/EP2020/080761 filed on Nov. 3, 2020, which claims priority to German Patent Application 102019131283.3 filed on Nov. 20, 2019, the entire content of both are incorporated herein by reference in their entirety.

FIELD OF THE INVENTION

The present invention relates to a method for determining a state value of a traction battery of an electric vehicle, which characterises the ageing state of the traction battery, preferably an SoH value of the traction battery, wherein the traction battery is charged or discharged by means of a test load and, at at least one point in time, a respective output voltage and charging or discharging current value pair of the traction battery is acquired, wherein an ohmic internal resistance of the traction battery is established on the basis of the acquired output voltage and charging or discharging current value pair, and wherein the state value of the traction battery is established on the basis of the established ohmic internal resistance.

BACKGROUND OF THE INVENTION

Electric vehicles are increasingly being used in order to reduce emissions of climate-damaging gases, especially $CO_2$, in the transport sector. This applies not only to passenger cars, but also to trucks. At least some of the electric power required to operate electric vehicles is temporarily stored in a traction battery and made available on demand. The stated traction battery is thus a rechargeable battery or storage battery.

The stated electric vehicles need not necessarily only be those electric vehicles whose operating power is provided solely by the traction battery. Instead, the term "electric vehicle" also encompasses those vehicles in which an electric drive is combined with another drive, e.g. an internal combustion engine, i.e. what are known as hybrid vehicles.

The term "electric vehicle" furthermore encompasses not only vehicles in which the traction battery is charged by an external power source, but also those vehicles in which at least some of the electrical operating power can also be generated on board the vehicle, for example by means of a fuel cell system and/or by means of solar cells.

The term "electric vehicle" also encompasses any other vehicles in which at least some of the drive power is provided by the traction battery, for example bicycles with electric drive assistance, such as e-bikes, pedelecs and cargo bikes, e-scooters, or electrically powered small motor scooters, and indeed electrically powered wheelchairs.

Batteries having cells which are based on lithium-ion technology are currently widely used as traction batteries due to their relatively high specific storage capacity, i.e. storage capacity in relation to the weight of the traction battery. There are, however, also traction batteries in use whose battery cells are based on long-established lead technology. The method and the advantageous developments thereof described herein are in any event not limited to one specific type of battery cell, but can instead be applied to various types of traction battery or types of battery cell.

Electric vehicle traction batteries, like other types of rechargeable batteries, such as those used for example in mobile telephones or other electrical or electronic devices, are subject to an ageing process which is determined both by ageing over time and by ageing due to use, i.e. the number of charge and discharge cycles. The ageing process of a traction battery results, among other things, in the storage capacity of the traction battery declining over time.

In a typical lithium-ion battery, approximately 80% of the original storage capacity is usually still available after a service life of 3 to 4 years. After 6 years, approximately only 60 to 70% of the original storage capacity remains. In this respect, a significant decrease in capacity generally occurs over the life cycle. Storage capacity may, however, vary considerably depending on the actual use of the traction battery. High temperatures, high charging and/or discharging currents, deep discharging or high continuous loads cause particularly severe ageing and an associated decrease in storage capacity.

FIG. 1 shows an example of a traction battery ageing curve. For a traction battery with a normal storage capacity $Q_N$ of 70 Ah, this curve indicates the actual storage capacity Q in ampere-hours (Ah) as a function of the number of ageing cycles. The test on which the curve is based was carried out at an ambient temperature of the traction battery of 40° C. The charging current was 1 C, while the discharging current was 3 C for determining the ageing cycles N. In the indications 1 C and 3 C the quantity C represents the charging or discharging current in amperes (A) with the numerical values of the traction battery's nominal storage capacity $Q_N$.

The actual storage capacity Q of a traction battery can thus be measured not only by fully discharging a fully charged traction battery while continuously measuring the discharge current and the discharge time, but also by means of an alternative method in which the ohmic internal resistance of the traction battery is established by applying a test load on the basis of a respective value pair, established at at least one point in time, of an output voltage and a charging or discharging current of the traction battery. The correlation between the actual capacity Q and the ohmic internal resistance $R_i$ of a traction battery is shown by way of example in FIG. 2. A test load can take the form of a load resistance, i.e. energy sink or current consumer, which brings about a discharging current, or of a charging device, i.e. an energy source or current generator, which brings about a charging current. A load current may accordingly be a discharging current or a charging current.

Using this correlation, it is then possible to establish a traction battery state value which characterises the ageing state of the traction battery. The actual storage capacity of the traction battery can, for example, be established as the state value. It is, however, more usual to indicate the state value in the form of a health value, wherein "health value" is used synonymously with the more usual term "SoH value" (SoH="State of Health"). The SoH value describes the ratio of the current storage capacity, which is reduced due to ageing, of the traction battery to its original, ideal or nominal storage capacity and is generally stated in percent.

Establishing the ohmic internal resistance of the traction battery as mentioned above on the basis of an acquired output voltage and charging or discharging current value pair on application of a known test load is based on an electrical model or an equivalent circuit diagram for a battery or a battery cell. FIG. 3 shows such an exemplary equivalent circuit diagram, which characterises the structure of a battery cell consisting of a voltage source, various resistors $R_1$ to $R_4$ and various capacitors $C_2$ to $C_4$. It is also possible to use other equivalent circuit diagrams, for example with only one serial ohmic internal resistor $R_1$ and one R-C element $R_2$, $C_2$. The usability of such a battery model or equivalent circuit diagram for simulating battery behaviour has been demonstrated many times in the prior art, for example in the publication "Beitrag zur Bewertung des Gesundheitszustands von Traktionsbatterien in Elektrofahrzeugen" [contribution to the assessment of the state of health of traction batteries in electric vehicles], Phan-Lam Huynh, Wissenschaftliche Reihe Fahrzeugtechnik Universität Stuttgart, ISBN 978-3-658-16561-1, 2016. To establish the parameters, i.e. in particular the resistance and capacitance values of the equivalent model, a test rig can be used for establishing the voltage drop or the time profile thereof as the result of a load-induced current pulse and the charging or discharging current.

Investigations have revealed that the stated parameters are dependent inter alia on the battery's state of charge (SoC), its state of health (SoH) and its temperature. In particular, ohmic resistance ($R_1$) is dependent on battery temperature and the state of charge (SoC). The SoC describes the current state of charge of storage batteries and is usually stated in percentage values, wherein 100% represents a fully charged storage battery. 100% minus the state of charge value gives the depth of discharge (DoD or DOD).

It has furthermore been found that, as ageing proceeds as a result of the number of charging/discharging cycles and the consequent reduction in SoH, it is in particular the ohmic resistance $R_1$ that increases. A comparatively smaller change is observed for resistances $R_2$ to $R_4$ and capacitances $C_2$ to $C_4$.

Resistances $R_2$ to $R_4$ and capacitances $C_2$ to $C_4$ undergo comparatively little change as battery temperature rises. Ohmic resistance $R_1$, in contrast, decreases significantly with increasing temperature.

It has furthermore been found that ohmic resistance $R_1$ remains virtually constant over a wide SoC range of generally 10 to 90%, in particular of 30 to 90%. No major rise in ohmic resistance $R_1$ is observed until the battery is more than 90% discharged.

In summary, the investigations carried out on individual cells have shown that substantially only temperature and ageing have a significant influence on the resistance and capacitance values of the equivalent model, whereas the state of charge of the cells has hardly any influence on ohmic resistance.

It has furthermore been found that the value of ohmic resistance $R_1$ is most suitable for drawing conclusions about the ageing state of the battery. It is well known that the storage capacity of a traction battery decreases over time, while internal resistance increases. It is furthermore known that internal resistance increases over the course of a long continuous load, such as for example a high-speed motorway trip, and power delivery capability is impaired with increasing continuous load. FIG. 10, for example, shows a tendency for internal resistance $R_i$ to increase as traction battery discharge continues, wherein, over the course of time, the influence of further R-C elements, see the battery equivalent circuit diagram in FIG. 3, leads over an extended time range, i.e. under long-term load, to clearly non-linear internal resistance behaviour, which can be a multiple of the internal resistance $R_i$ in the idle state. Previously used methods usually take this total resistance into consideration for evaluating continuous power capability and are unsuitable for ascertaining the magnitude of the serial internal resistance $R_1$ of the equivalent circuit diagram according to FIG. 3.

Conventional methods for determining the state of a traction battery are characterised by an energy-intensive, full discharge process. Determination becomes uncertain here due to the error-influencing parameters discharge rate, initial discharge voltage, final discharge voltage and the temperature to be considered. A conventional duration of a diagnostics determination is at least 3 hours. In order to gain access to battery values such as current and voltage, vehicle attachments have to be disassembled in order to obtain a galvanic connection to physical measurement points. A continuous discharge load, such as for example a rolling road test rig, road test, or battery testing system, is also necessary, which is time- and labour-intensive, and means a high energy input entailing recharging of the traction battery after completion of the diagnostics.

Impedance spectroscopy is an alternative diagnostics method. This involves determining an impedance, i.e. the AC resistance, of a traction battery as a function of the frequency of an alternating voltage or current. Impedance spectroscopy usually proceeds by imposing an alternating voltage, i.e. the potential of the working electrode is sinusoidally modulated and the current and the phase thereof are measured. However, this requires direct galvanic access to the battery and complex interpretation of the results.

For the technical investigation and/or evaluation of electric vehicles, in particular a commercial evaluation of used vehicles, it is desirable also to ascertain the state of the traction battery independently of environmental influences or specific measurement conditions.

SUMMARY OF THE INVENTION

The problem addressed by the invention is that of further developing a method of the initially stated type in such a way that it allows a state value of a traction battery, preferably a SoH value, to be established quickly and straightforwardly.

The problem is solved by a method having the features disclosed herein. Advantageous developments of the method are disclosed herein.

The invention provides that at least one normalisation variable which characterises the traction battery is established and that, on the basis of the established ohmic internal resistance and the at least one normalisation variable, a normalised internal resistance based on a reference value of the normalisation variable is established, wherein the state value of the traction battery is established on the basis of the normalised internal resistance. The ohmic internal resistance of the traction battery can thus be normalised to one or more normalisation variables. These normalisation variables are in particular parameters which in each case characterise a property or state of the traction battery and can have an influence on the value of the established internal resistance. One example of a normalisation variable is the temperature of the traction battery, as will be explained in greater detail below.

If a plurality of normalisation variables are taken into consideration, the normalised internal resistance can also be established in a plurality of iterations.

The measured ohmic internal resistance is thus converted into an internal resistance normalised to one or more normalisation variables, which enables comparability of internal resistance measurements carried out on different traction batteries and under different conditions by eliminating the boundary conditions of the internal resistance determination due to normalisation. The normalised internal resistance can then finally be used to establish the state value, for example the SoH value, of the traction battery, wherein a mathematical function or table, for example a lookup table, can be used as the basis. At least two value pairs of current I1, I2 and voltage U1, U2 are preferably established for this purpose in order to determine at least one differential current dI=I2−I1 and at least one differential voltage dU=U2−U1 for establishing the resistance, wherein the internal resistance results from $R_i$=dU/dI.

In general, for the purpose of establishing the internal resistance, the charging or discharging by a test load is designed such that the charging current or discharging current changes according to a step change function. In order also to establish the temporal behaviour of the changes in output voltage and/or load current, provision may also be made to acquire a plurality of value pairs temporally before and temporally after the step change in load, wherein the time interval can be equidistant or variant. The measured value density is preferably increased directly in the load current range.

A normalised internal resistance for establishing the state value is straightforward to establish. The value can, for example, be established with little signal processing effort using a characteristic function. One conceivable alternative solution, which is based on a reference performance map which must take account of a plurality of relevant parameters, is considerably more complex than the solution according to the invention. In particular, the normalisation method according to the invention enables a significant reduction in the effort involved in an initial characterisation of a particular type of battery cell in order to establish the correlation between said state value and the ohmic internal resistance. This makes it possible quickly and economically to evaluate different types of traction batteries, which can also have different ageing states, with regard to their state, in particular their SoH.

The state of the traction battery can thus be established very quickly in a few minutes, inexpensively, with low error tolerance and without disassembly. The method according to the invention is characterised by a low energy load on the traction battery. Furthermore, only compact, inexpensive test equipment is required as the diagnostics device. Due to the normalisation methodology, only relatively slight errors are involved and independence from manufacturer-provided energy buffers is achieved. Direct galvanic access to the traction battery or to measuring points for current-voltage measurements is not necessary.

The measured values can be tapped indirectly via a diagnostics interface of the vehicle, i.e. the OBD (on-board diagnostics) interface. Measured values can be tapped via a standard connector using a serial interface with a standard protocol such as K-Line or via the CAN bus. This can usually be achieved using a plug-in dongle with, if necessary, a wireless connection to a diagnostics device, for example in the form of a mobile data terminal such as a smartphone, tablet or notebook.

According to a preferred development of the method, discharging proceeds during an evaluation run of the electric vehicle, wherein the test load is formed by a unit of the electric vehicle, preferably by a drive motor of the electric vehicle. The test load can be connected to initiate the charging or discharging process, for example, by briefly accelerating strongly and then braking. Braking to establish the internal resistance can also be omitted and is primarily performed for test drive-specific reasons. This results in a significant load on the traction battery. For example, a distance of less than 100 m, preferably up to 50 m, may be sufficient for such an evaluation run. The evaluation run may optionally be repeated once or a number of times. Efforts may here be made to take account of boundary conditions of this evaluation run which are suitable for influencing the load current (for example electric vehicle type, prevailing weather conditions, conditions, state of the road, incline of the road, a load in the electric vehicle, or influences of a drive motor controller) for example in such a manner that respective ranges for the boundary conditions are specified which may not be undercut or exceeded. Alternatively or additionally, the boundary conditions may also be taken into account by being included in the method in the form of one or more further characterising. The exposure time of the test load can be very short in the range from 10-100 ms up to 10 seconds. Test loads may, however also last from 1 second to 30 seconds, even up to 2 minutes and in particular require between 5 and 15 minutes. The load current may usually be a discharging current but may also be an imposed charging current.

According to a further preferred development of the method, a first normalisation variable is a temperature of the traction battery during acquisition of the output voltage and load current values and the reference value of the first is a reference temperature. The internal resistance established at a specific battery temperature can thus be converted to a normalised internal resistance based on the reference temperature.

A second normalisation variable preferably characterises a type of traction battery, and the reference value of the second normalisation variable is a normalisation factor which relates different types of traction batteries to one another, wherein the normalisation factor is specified on the basis of at least one battery type parameter. The battery type parameter may for example characterise the cell type of the traction battery, for example lithium-ion or lead technology, and/or also represent the type of arrangement of the cells of the traction battery, for example a particular number of battery cells connected in series and/or parallel. The normalisation factor is preferably obtained empirically, for example by reference measurements on batteries of a given type in as new condition. In principle, mathematical or statistical methods can also additionally be used when establishing the normalisation factor, for example interpolation or extrapolation, i.e. the battery type parameter or the associated second normalisation factor which was established for a battery with a certain number of parallel-connected rows and a certain number of batteries per row can be converted to batteries in which the stated numbers of cells differ therefrom. The normalisation factor is generally dimensionless.

Still further normalisation variables, such as for example the state of charge (SoC) of the traction battery, can furthermore also be taken into account.

According to a further preferred development of the method, the state value is established on the basis of the normalised internal resistance using a mathematical model or a table, preferably a lookup table or a performance map, wherein parameters or values which describe the mathematical model or the table are preferably retrieved from a database. The database is preferably stored on a server, wherein the parameters or values are retrieved via a wireless and/or wired data link, for example a mobile data link or an internet connection. The state value can thus be normalised, i.e. converted into a comparable variable using reference values.

A further advantageous development of the method provides that a first normalisation variable is a temperature of the traction battery during acquisition of the output voltage and load current values and the reference value of the first normalisation variable is a reference temperature. For this purpose, the temperature of the traction battery is established in that, in a first measurement step, a first ambient temperature and a first ohmic internal resistance of the traction battery are established at a first point in time and, in a second measurement step after a predetermined period of time has elapsed, a second ambient temperature and a second ohmic resistance of the traction battery are established at a second point in time. On the basis of the difference of the first and second ohmic internal resistance and the specified period of time, a rate of change in internal resistance is established. On the basis of the rate of change in internal resistance, a differential temperature between the ambient temperature and the temperature of the traction battery is established. The temperature of the traction battery is established by addition of a reference ambient temperature established from the first and/or second ambient temperature and the established differential temperature.

As has already been explained above, the ohmic internal resistance of the traction battery depends to a considerable extent on the temperature of the traction battery. In many electric vehicles, direct access to the traction battery for establishing the battery voltage and the charging or discharging current is not possible. These parameters are provided regularly, as are current and voltage values at an interface of a vehicle diagnostics system (OBD, on-board diagnostics), for example in the form of value pairs which are generated at a certain fixed or variable sampling rate. Often, however, the battery temperature, which may optionally be established by the vehicle diagnostics system at one or more locations, is not provided or is provided only in encrypted form. Under certain circumstances, the battery temperature can only be read out with considerable additional time or processing effort, wherein additional manufacturer-specific requirements often have to be taken into account.

The above-stated development of the method provides one possible way of indirectly establishing the battery temperature. This approach takes advantage of the fact that a battery temperature that deviates from the ambient temperature adapts to the ambient temperature over time, at least if the battery temperature is not affected by prolonged charging and/or discharging processes. Adaptation of the battery temperature to ambient temperature follows an "acclimatisation gradient", which is characteristic of the battery type used and depends inter alia on the design of the traction battery, in particular on the number and arrangement of the battery cells present in the traction battery. The traction battery has a rate of change of its internal resistance, i.e. a difference in resistance per unit time, which depends on the difference between the battery temperature and the ambient temperature, i.e. said differential temperature. This dependency of the rate of change in internal resistance on the differential temperature is described by a non-linear function. On the basis of a measurement of the rate of change in internal resistance, it is possible to establish the temperature difference prevailing at the time of measurement. The temperature of traction battery is then calculated from the reference ambient temperature and the established differential temperature, wherein the reference ambient temperature may be established, for example, by averaging the first and second ambient temperatures. Assuming that the ambient temperature has not changed or has not changed significantly between the two stated points in time, the reference ambient temperature can also be equated to the first or second ambient temperature.

The above-stated predetermined period of time between the two measurement steps is preferably between five and fifteen minutes. Within this period, a sufficiently large change in traction battery temperature can be expected to result in a corresponding change in the ohmic internal resistance of the traction battery.

In principle, the first ohmic internal resistance can be used to determine the state value of the traction battery. According to a preferred development of the method, the state value of the traction battery is established on the basis of the second ohmic internal resistance. It is assumed for this purpose that, at the time of establishing the second ohmic internal resistance, the battery temperature will have approximated more closely to the ambient temperature than was the case at the first point in time. It follows that, due to the smaller differential temperature, the rate of change in internal resistance also decreases, so improving measuring accuracy. In addition, there is no need for a renewed measurement of the ohmic internal resistance, since the actual ohmic internal resistance measured at the second point in time for establishing the temperature can also be used for establishing the state value.

The current profile of the load current changes on application of the test load. This may for example take the form of a current ramp, i.e. a linear rise or fall in a charging or discharging current. According to a further advantageous development of the method, charging or discharging proceeds by means of the test load such that a step change in load current occurs when the test load is connected. The load current can thus be measured in the form of a step change response.

Preferably, a measurement sequence of output voltage and load current value pairs is acquired starting with the connection of the test load, wherein the measurement sequence comprises a plurality of output voltage and load current value pairs acquired at a rapid succession of points in time. In this way, the time profiles of the output voltage and the load current can be established, such that non-ohmic components of internal resistance, i.e. impedances, can ultimately also be established. An impedance consists of an imaginary part, i.e. a reactance, and a real part, i.e. an ohmic resistance. Reactance is generally negligibly small, such that the impedance estimates ohmic resistance quite accurately.

The measurement sequence thus represents the step change response to the step change in load or current generated when the test load is connected. The time intervals at which the respective value pairs are acquired may be constant (i.e. a fixed sampling frequency or rate is provided) or also vary, wherein the time density is preferably at the time of the step change in load. The time intervals may optionally also be specified by the OBD and not be influenceable.

To ensure that the step change in current or load can be optimally sampled, the measurement sequence can be acquired in such a way that a first value pair is acquired at the latest immediately at the time of connecting the test load, wherein however the measurement sequence may preferably also be recorded a few milliseconds before the step change in current. The phrase "starting with the connection of the test load" therefore also includes this case.

It is preferably provided that at least one output voltage and load current value pair is additionally acquired before the test load is connected, on the basis of which an open-circuit voltage $U_0$ and a closed-circuit current $I_0$ are established. On this basis, the ohmic internal resistance for a respective further value pair of the measurement sequence can be established as the quotient of the difference of the acquired output voltage and the open-circuit voltage $U_0$ and the difference of the acquired load current and the closed-circuit current $I_0$. Parameters of a logarithmic function, which models the profile of the measurement sequence, can then be established for the measurement sequence by means of a mathematical adjustment calculus, wherein, on the basis of the logarithmic function, the ohmic internal resistance can be at least approximately established at a desired point in time, preferably at the time of the step change in current, or at a corresponding frequency.

The open-circuit voltage $U_0$ or the closed-circuit current $I_0$ are taken to mean respectively the output voltage or load current which prevails when the traction battery is loaded with a base load, wherein the base load has a substantially higher ohmic resistance than the test load.

Investigations have revealed that the time profile of internal resistance has the profile of a logarithmic function immediately after connection of the test load. By fitting the parameters of a logarithmic function to the value pairs of the measurement sequence as described here, the ohmic internal resistance can be established particularly accurately, since the actual measured internal resistance can be established at a desired point in time, in particular with respect to the time of the step change in current. Interpolation with a logarithmic function means that the internal resistance $R_i$ can take place at a point in time which is very close to the load activation time $t_0$, or at another point in time $t_i$, with relatively high accuracy, even if no or only imprecise data are available for this point in time.

It is also particularly advantageous to make use of a compensation function if the time reference between the points in time of acquiring a respective value pair and the time of the imposed step change in current (connection of the test load) cannot be recorded exactly. The temporal correlation can then subsequently be established from the profile of the logarithmic function, for example by introducing a temporal shift constant $t_{offset}$, wherein by maximising a coefficient of determination $R^2$ on variation of the shift constant $t_{offset}$ between the function curve and the measured values the step change time can be estimated as accurately as possible. The coefficient of determination $R^2$ describes in this connection a goodness of fit of a regression, in particular of a regression function of internal resistance behaviour, in order to evaluate how well the measured values fit the assumed model of internal resistance.

Evaluation of the compensation function also takes account of the fact, already explained at the beginning, that the internal resistance of the traction battery has a complex value, i.e. comprises a frequency-independent real part and a frequency-dependent imaginary part. The real part of the complex internal resistance corresponds to the ohmic internal resistance, wherein, depending on the test conditions, the latter is not usually directly measurable. Even though the imaginary part of the internal resistance is significantly, i.e. approximately by an order of magnitude, smaller than the real part, taking the imaginary part into account when establishing the internal resistance can improve accuracy. As a rule, the influence of the imaginary part on the total impedance is negligible.

In principle, the internal resistance can be established not only in the form of a step change response, but also by periodic load changes, wherein the period or frequency of these load changes is varied. This method is known as impedance spectroscopy. The result of such impedance spectroscopy is shown for an exemplary traction battery in FIG. 13, wherein establishing the real and imaginary parts $Re(Z)$ and $Im(Z)$ entails relatively significant technical effort. FIG. 13 shows what is known as a Nyquist plot, i.e. each point of the imaginary part $Im(Z)$ and of the real part $Re(Z)$ of the complex internal resistance Z is represented at a specific frequency.

If the time profile of the internal resistance for a traction battery is known for a known type, age, state of charge, temperature and other parameters, the position of the load activation time can be determined relatively accurately with the assistance of the fitted logarithmic function. Alternatively, this activation time can be estimated by varying the assumed location of this point in time and maximising the coefficient of determination $R^2$.

For this purpose, $R_i$ is established by means of the measurement profile for the battery using the described least squares method. The resultant internal resistance $R_i$ is dependent on time and can in principle be determined according to the following formula:

$$R_i(t_i) = a \cdot \ln(t_i) + b,$$

wherein $t_i$ is the time which has elapsed since the load was connected, $R_i(t_i)$ is an interpolated internal resistance at time $t_i$, and a and b are parameters. In this case, b corresponds to the internal resistance $R_i$ at an investigation frequency of 1 Hz or the internal resistance after 1 s on application of a step change function. The factor a approximates the influence of the RC elements on time response in the equivalent model (FIG. 3) described above.

The above-stated dependency can also be stated in refined form as $$R_i(t_i) = a \cdot \ln(t_i + t_{offset}) + b,$$

wherein $t_{offset}$ is the time between the actual activation time and a suspected activation time. For this purpose, using optimisation a good estimation of $t_{offset}$ can be made by a maximum coefficient of determination $R^2$, wherein the coefficient of determination $R^2$ serves to assess the goodness of fit of the regression, i.e. how well the measured values fit the underlying battery model. This permits a determination of the difference between the estimated and actual switching times and allows the actual switching time to be established. $t_{offset}$ may thus initially be set to zero. The coefficient of determination $R^2$ can be used to determine the quality of the curve. By varying $t_{offset}$, it is possible to optimise for maximum $R^2$ and thus estimate the activation time relatively precisely. The activation time is then at $t_{1Sek} - t_{Offset} - 1\,\text{Sek}$. This only applies to step change excitations, and is only of limited use for ramped excitations.

An equation analogous to the one above can also alternatively describe the dependence of internal resistance $R_i$, on investigation frequency f, wherein the following then applies:

$$R_i(1/f) = a \cdot \ln(1/f) + b$$

Further optimisation methods which enable higher signal processing accuracy are proposed below.

According to a further preferred development, an expected load current is predetermined by the test load, preferably by an ohmic resistance of the test load, and by the output voltage (e.g. a nominal output voltage or an open-circuit output voltage) of the traction battery, wherein those value pairs in which a difference between the expected load current and the acquired load current exceeds a predetermined tolerance value are not taken into account for establishing the ohmic resistance of the traction battery. This allows implausible value pairs to be excluded when establishing the state value. The stated tolerance value may be for example 20%, preferably 10%, particularly preferably 5% of the expected load current.

A further preferred development provides that the at least one output voltage and load current value pair of the traction battery is acquired in a plurality of passes, wherein in each pass the test load is connected and removed again at the end of the pass, at at least one point in time of a pass a respective value pair is acquired and a respective ohmic resistance of the traction battery is established on the basis of the acquired value pair, and wherein an average value for the ohmic internal resistance is established from respective ohmic internal resistances established in the plurality of passes, wherein the state value of the traction battery is established on the basis of the average of the ohmic internal resistance. This repeated connection of the test load makes it possible to increase accuracy in establishing the state value by averaging.

A further preferred development provides that establishing the ohmic internal resistance of the traction battery furthermore comprises at least one of the following steps:
  a) for at least one value of a value pair, a respective valid measurement range is defined, wherein a value pair is not taken into account if one or both values are outside the respective measurement range, wherein the measurement range is preferably defined on the basis of an absolute value or a rate of change of the associated value.
  b) Technical shortcomings may mean that individual erroneous measured values are collected which stand out due to significant deviation from the expected values. Such outliers lead to significant errors when establishing the state value. These erroneous measured values may be evaluated and screened out according to fixed criteria, wherein various criteria may be defined for screening out. If the voltage and/or current of a value pair are significantly outside the expected measurement range, the value pair can be discarded. The measured values can be evaluated both absolutely and relative to temporally adjacent measured values.
  c) A measurement sequence of output voltage and load current value pairs is acquired, wherein the test load is connected throughout the duration of the measurement sequence, wherein the measurement sequence comprises a plurality of output voltage and load current value pairs acquired at a rapid succession of points in time, wherein a value pair is not taken into account if one or both values of this pair are equal to the corresponding value of at least one value pair acquired at a previous point in time.
  d) This makes it possible to screen out for example "stuck" measured values, in which one or both values of a value pair do not change over one or more successive measurements due to errors.
  c) A measurement sequence of output voltage and load current value pairs is acquired, wherein the test load is connected throughout the duration of the measurement sequence, wherein the measurement sequence comprises a plurality of output voltage and load current value pairs acquired at a rapid succession of points in time, wherein the measurement sequence is subjected to low-pass filtering.
    a) Low-pass filtering can improve the accuracy of establishing the state value in the event of erroneous measured values, especially if it is not possible to repeat the measurement in a plurality of passes.
  d) A measurement sequence of output voltage and load current value pairs is acquired, wherein the test load is connected throughout the duration of the measurement sequence, wherein the measurement sequence comprises a plurality of output voltage and load current value pairs acquired at a rapid succession of points in time, wherein
    a) d1) a moving average value of the ohmic internal resistance is established from the output voltage and load current value pairs of the measurement sequence, wherein the respective ohmic internal resistance for two respective value pairs acquired in immediate succession is preferably established from the difference of the two output voltages divided by the difference of the two load currents and the moving average of the ohmic internal resistance is formed by the average of the respective ohmic resistances established in this manner, or
    b) d2) the ohmic internal resistance is established from the respective output voltage and load current value pairs on the basis of a mathematical adjustment calculus, preferably according to the least square fit method.

According to variant d1, evaluation, i.e. establishing the ohmic resistance, is performed repeatedly in succession on the same measurement sequence, wherein an average is then formed.

As an alternative to establishing the moving average, according to variant d2 the ohmic internal resistance can be established from the plurality of value pairs on the basis of a mathematical adjustment calculus, preferably according to the least square fit method. In graphical terms, voltage is plotted against the current (or vice versa) for each value pair and a established according to the least square fit principle. In comparison with the alternative moving average method described above, using an adjustment calculus provides reliable results even with a very small number of value pairs.

Both methods in indent d) can be further improved by the use of further statistical procedures, such as establishing a range, an interquartile range, a variance, a scatter or a standard deviation, and, if need be, may be discarded if data quality is too low. These statistical methods can be applied both to the result and to the raw measurement data, i.e. the original current and voltage values.

Two or more of these above-stated methods can also be combined with one other in order to achieve still further improvement in data quality.

A voltage, in particular an open-circuit voltage, of the traction battery can be determined approximately in a voltage-current diagram if no direct measured value pair with a current, in particular a closed-circuit current $I_0$, and a voltage, in particular an open-circuit voltage $U_0$, is available. For this purpose, at least two, in particular a plurality of measured value pairs of current and voltage should be compared and a best fit line established through the measured value pairs by means of the least squares method. For example, determining a point of intersection of this best fit line with the current axis I, i.e. at the closed-circuit current $I_0$, makes it possible to estimate the open-circuit voltage $I_0$ of the battery at a current state of charge.

Excitation of the traction battery by a load current may proceed in the form of a charging or discharging current. Excitation may be ramped excitation or step change type excitation. If a step change type excitation is present, the previously established open-circuit voltage $U_0$ and closed-circuit current $I_0$ may be used as a reference to determine internal resistance $R_i$. Identification of the step change time can be improved by optimising the coefficient of determination $R^2$ of a curve fit. Improved identification of time-dependent internal resistance $R_i(t_i)$ can furthermore be achieved.

The present invention further relates to a diagnostics device for determining a state value of a traction battery of an electric vehicle, wherein the diagnostics device has an evaluation unit which is directly or indirectly couplable to the traction battery and is set up to carry out the method according to one of the above-described preferred embodiments according to the invention. Direct coupling of the diagnostics device to the traction battery is in particular taken to mean coupling in which the diagnostics device can be coupled to voltage or current measurement points of the traction battery. Indirect coupling in particular consists in the diagnostics device being coupled to a diagnostics apparatus, in particular an on-board diagnostics system (OBD) of the electric vehicle, wherein this diagnostics apparatus of the electric vehicle transmits at least the output voltage and load current values, preferably also of the temperature of the traction battery, to the evaluation unit.

The diagnostics device can preferably access a central data repository with regard to battery data, such as vehicle type, battery type, historic measured values or fleet-wide comparison values. The data repository may in particular be implemented as central cloud storage on the internet.

Advantageously, not only can the diagnostics device be regularly and independently supplied with new software updates, but the central data repository can be regularly supplemented with measured values and diagnostics results of various temporally and spatially distributed diagnostics processes. Analyses based thereon can also enable type-specific or fleet-related evaluations with regard to the SoH behaviour of the traction battery in relation to an individual vehicle.

The diagnostics device advantageously comprises a mobile portable, independently and wirelessly couplable display and/or input device that can be used in the context of a test inspection inside or outside the vehicle to control a diagnostics process and display diagnostics data. In particular, the diagnostics device can take the form of a conventional mobile terminal such as a smartphone, tablet or notebook.

BRIEF DESCRIPTION OF THE DRAWINGS

Further advantages are revealed by the present description of the drawings. The drawings show developments of the invention. The drawings, and description contain numerous features in combination. A person skilled in the art will expediently also consider the features individually and combine them into meaningful further combinations.

In the drawings.

DETAILED DESCRIPTION OF THE INVENTION

Figure 4:
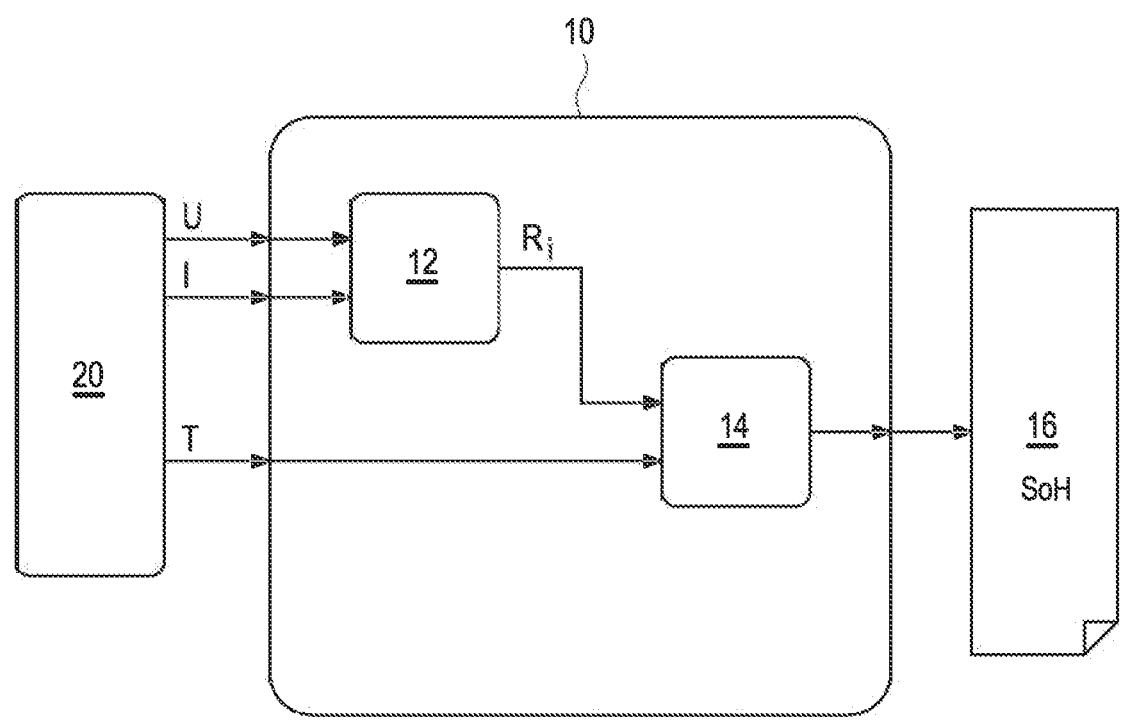
FIG. 4 is a block diagram which shows the establishment of a state value of a traction battery according to one development of the method according to the invention.

FIG. 4 shows a block diagram illustrating the determination of a state value of a traction battery of an electric vehicle 20 by means of a diagnostics device 10 which is set up to carry out a method according to one development of the present invention. The diagnostics device 10 has an evaluation unit which comprises at least an establishing module 12 and a normalisation module 14.

The diagnostics device 10 is indirectly coupled to the traction battery (not shown) of the electric vehicle 20, such that the values of an output voltage U, a load current I and a temperature T of the traction battery can be transmitted to the evaluation unit. Coupling to the traction battery may be made either directly to corresponding measurement points or sensors or indirectly via an interface to an on-board diagnostics apparatus (OBD) of the electric vehicle 20.

The traction battery of the electric vehicle 20 can be coupled to a test load, for example a drive motor of the electric vehicle 20, in order to cause the traction battery to discharge.

The output voltage U and load current I are transmitted to the diagnostics device 10 in the form of respective value pairs, wherein both an individual value pair and a measurement sequence of a plurality of value pairs established at specific time intervals can be acquired by the diagnostics device 10.

The establishing module 12 is designed to determine an ohmic internal resistance of the traction battery. In addition to the actual calculation of the ohmic internal resistance from the output voltage U and the load current I, the establishing module 12 can carry out further data processing steps, as will be explained in greater detail below in particular with reference to further developments of the method according to the invention or of the diagnostics device according to the invention.

The established ohmic internal resistance is transmitted to a normalisation module 14. In addition, the temperature T of the traction battery is also transmitted to the normalisation module 14. The temperature T of the traction battery, hereinafter also denoted battery temperature in abbreviated form, is established in the exemplary embodiment according to FIG. 4 by means of a sensor system which may be disposed inside the traction battery, and transmitted to the normalisation module 14. An alternative way of establishing battery temperature T is explained as a variant in an exemplary embodiment which is to be described in greater detail below.

Since, as explained in detail above, the ohmic internal resistance of the traction battery to a considerable extent depends on battery temperature, a normalised internal resistance is established in the normalisation module which converts the ohmic internal resistance measured at the current battery temperature to a normalised internal resistance. The battery temperature thus constitutes a normalisation variable, wherein, on establishment of the normalised internal resistance, the currently established ohmic internal resistance is related to a reference internal resistance by means of a normalisation function or a normalisation table, which reference internal resistance was established at a reference temperature within the scope of test procedures carried out previously on traction batteries of identical or also different construction.

In order to be able to take account of different battery types, a normalisation factor can be taken into account as a further normalisation variable. The normalisation factor can be provided on the basis of at least one battery type parameter, wherein the battery type parameter may for example be a cell type (lithium-ion, lead, etc.), a number of battery cells connected in series and/or in parallel, or the like. The normalisation factor can be obtained empirically, for example by measurements on batteries in as new condition, and is generally dimensionless. The state of charge (SoC) of the traction battery can be taken into account as a further normalisation variable.

The test load can be connected, for example, by carrying out an evaluation run with the electric vehicle 20 over a relatively short distance of, for example, up to 100 m, preferably up to 50 m, wherein the highest possible acceleration is advantageously set here. The short evaluation run consists for example of a brief, powerful acceleration. As a rule, the load generally depends on various test boundary conditions (driving style of the tester, vehicle, weather conditions, road conditions such as pavement surface or inclination, vehicle load, functioning of a vehicle start control system, etc.). If necessary, relevant test boundary conditions can be taken into account in the form of further normalisation variables.

Normalisation may, for example, be carried out on the basis of a table, for example a lookup table or a performance map, or also on the basis of a mathematical model. If a plurality of normalisation variables are to be taken into account, normalisation, i.e. establishing the normalised internal resistance, can also be carried out in a plurality of sub-steps.

The parameters required for normalisation, i.e. performance map tables or performance map values or parameters of a mathematical model or a mathematical normalisation function, can be stored in the diagnostics device 10 and/or also be retrieved from an external database by the diagnostics device 10. The diagnostics device 10 may optionally also feed correction values for these parameters back into the database.

The normalisation module 14 is furthermore designed to establish a state value of the traction battery on the basis of the normalised internal resistance. In the present exemplary embodiment, the state of health (SoH) of the traction battery is output as the state value. The SoH can be calculated, for example, on the basis of an SoH allocation function or table that has been empirically established in prior testing. The SoH is output by way of example in the form of a log printout 16. It goes without saying that there are also other output options, for example by means of a display or also by means of wireless or wired transmission to appropriate display, acquisition or data processing devices. For example, the SoH value together with other acquired parameters, such as the input parameters U, I and T and optionally vehicle identification data, can be transmitted to a central server, from where transmission is made in paper or electronic form, for example to users of the electric vehicle or to a workshop.

One advantage of such central data storage is that different traction batteries or electric vehicles, even those not initially tested, can be analysed. For example, a kind of standard can be defined for several similar traction batteries or electric vehicles, which is composed of empirical values from a plurality of batteries or electric vehicles. In comparison with making reference to a single reference battery, the influence of any manufacturing tolerances can thus be reduced and, given an appropriately large database, the respective ageing state of the traction battery can also be taken into account.

A further advantageous development of the method or diagnostics device is described with reference to FIGS. 5 to 7. The measured values of output voltage U and load current I required for establishing the battery's internal resistance are generally provided by an OBD of the electric vehicle or another interface, as access to components under high voltage inside the battery is usually not possible for safety reasons. However, depending on the specific manufacturer, the battery temperature T is often not provided at all or only in encrypted form. In order to ensure that the diagnostics device or method can be used as independently of the manufacturer as possible, this advantageous development provides an alternative method for establishing battery temperature.

This exploits the fact that, when determining the state value, the battery temperature differs from the temperature of the environment in which the traction battery test is to be carried out. In an exemplary situation, which forms the basis for FIG. 5, it is assumed that the electric vehicle was parked outside, such that the traction battery only has a temperature T of about 4° C. at the start of the test. The test, on the other hand, is performed in a building where a room temperature or ambient temperature of approximately 24° C. prevails. Thus, over time t, the battery temperature will increase from 4° C. to the ambient temperature of 24° C. This process is non-linear and is represented by the solid line in FIG. 5.

Figure 5:
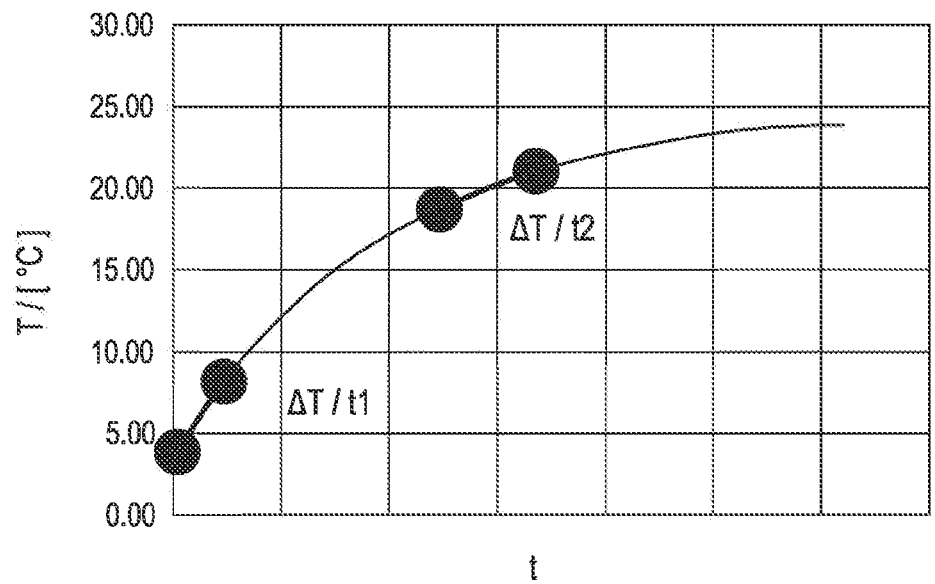
FIG. 5 is a diagram which shows the approximation of a temperature T of a traction battery to an ambient temperature as a function of the time t.

Two portions of this adaptation curve are additionally marked by two respective pairs of circles in FIG. 5. It is apparent from FIG. 5 that the rate of temperature change $\Delta T/t$, represented by the gradient of the curve, is relatively high at the beginning of the adaptation process (the portion of the curve enclosed by the left-hand pair of circles $\Delta T/t1$), i.e. where there is a large temperature difference, and decreases with increasing adaptation, i.e. with a decreasing temperature difference between the environment and the battery (the portion of the curve enclosed by the right-hand pair of circles $\Delta T/t2$). On the basis of the known fact that the ohmic internal resistance of the traction battery changes as a function of the battery temperature, a rate of change of the battery temperature can be established from the change in internal resistance per unit time, i.e. the rate of change in internal resistance $\Delta T/t$.

If the temperature scale on the y-axis of FIG. 5 is now normalised such that the value which the curve approaches over time is considered to be a differential temperature with a value of 0° C., the curve directly indicates the differential temperature between the ambient temperature and the battery temperature. On the basis of the rate of change in internal resistance, it is possible to establish the rate of temperature change and from the rate of temperature change, which as explained above corresponds to the gradient T/t of the curve in FIG. 5, the associated differential temperature can in turn be derived by appropriate calculation steps. Since the ambient temperature is known or can readily be measured, the battery temperature can be directly inferred on the basis of the ambient temperature and the differential temperature.

Figure 6:
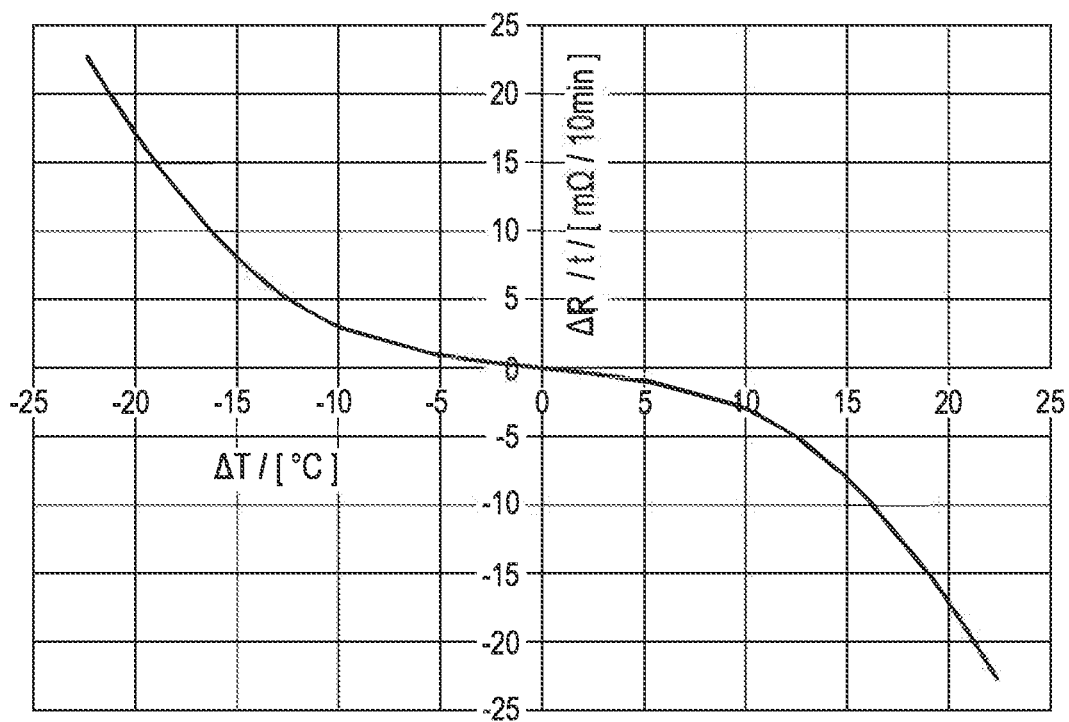
FIG. 6 is a diagram indicating a rate of change in internal resistance of a traction battery as a function of a temperature difference between a battery temperature and an ambient temperature by way of example for a specific battery type.

The correlation between rate of change in internal resistance over time $\Delta R_i/t$ and the differential temperature $\Delta T$ between the surroundings and the battery can also be directly represented in simplified manner by a corresponding curve $\Delta R_i/t$ plotted against $\Delta T$, see FIG. 6 with regard to battery-specific temperature behaviour. On the basis of this curve, which can be represented by a mathematical model or a table, the differential temperature can be read directly for a given rate of change in internal resistance.

The rate of change in internal resistance is established by determining at an interval of for example 5 to 15 min a first ohmic internal resistance and a second ohmic internal resistance of the traction battery. The difference of the first and the second ohmic internal resistance divided by the time interval between the two measurements then gives the rate of change in internal resistance $\Delta R_i/t$. Parallel to the measurements of ohmic internal resistance, the ambient temperature T can also be logged, from which the battery temperature can then be established by addition of the differential temperature. Should the ambient temperature T change slightly during the measurement, one of the two ambient temperatures or an average of the ambient temperatures T established at the different times can be used as the reference ambient temperature. Advantageously, more than two internal resistances $R_i$ can be established to achieve higher accuracy for determining the rate of change in resistance.

Figure 7:
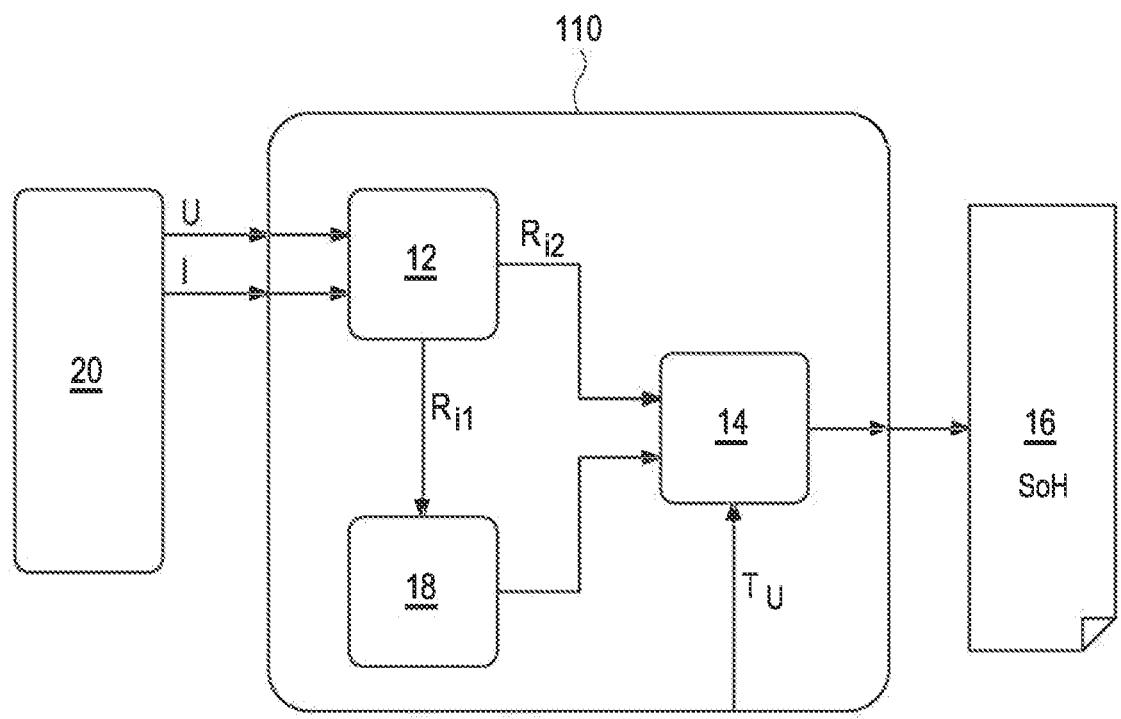
FIG. 7 is block diagram indicating the establishment of a state value of a traction battery according to a further development of the method according to the invention.

FIG. 7 shows a diagnostics device 110 designed for carrying out this variant of the method according to the invention. Since the diagnostics device 110 is a variant of the diagnostics device 10 shown in FIG. 4, only the significant differences are described below. Identical or similar elements are therefore provided with the same reference signs.

The diagnostics device 110 additionally has a buffer module 18 in which an internal resistance value $R_i$ established by the establishing module 12 can be temporarily stored. There is no provision for transmission of the battery temperature T from the electric vehicle 20 to the diagnostics device 110. Instead, the normalisation module 14 has an additional input, via via which an ambient temperature $T_U$ of the surroundings in which the electric vehicle 20 is located at the time of the measurements can be acquired.

At a first point in time, an internal resistance $R_i$ is established on the basis of the output voltage U and the load current I and transmitted to the buffer module 18 and temporarily stored there as internal resistance value $R_{i1}$. Once a predetermined period of time of for example between 5 and 15 min has elapsed, the output voltage U and the load current I are measured at a second point in time and converted in the establishing module 12 into a further internal resistance value $R_{i2}$. This second internal resistance value is transmitted to the normalisation module 14. The temporarily stored first internal resistance value $R_{i1}$ is simultaneously transmitted from the buffer module 18 to the normalisation module 14. The normalisation module now establishes the difference of the two internal resistance values $R_{i1}$, $R_{i2}$ and divides this difference by the period of time between the two measurement times.

On the basis of the rate of change in internal resistance established in this manner, the battery-specific curve of FIG. 6, which can be stored in the diagnostics device 110 for example in the form of a table or a mathematical function, is used as the basis for establishing an associated differential temperature. On the basis of this differential temperature and the ambient temperature $T_U$, the normalisation module 14 now establishes the battery temperature, which can then be used as the basis of the normalisation described with reference to FIG. 4.

Further developments and variants of the method according to the invention or of the diagnostics devices 10, 110 according to the invention will now be described with reference to FIGS. 8 to 12.

Figure 8:
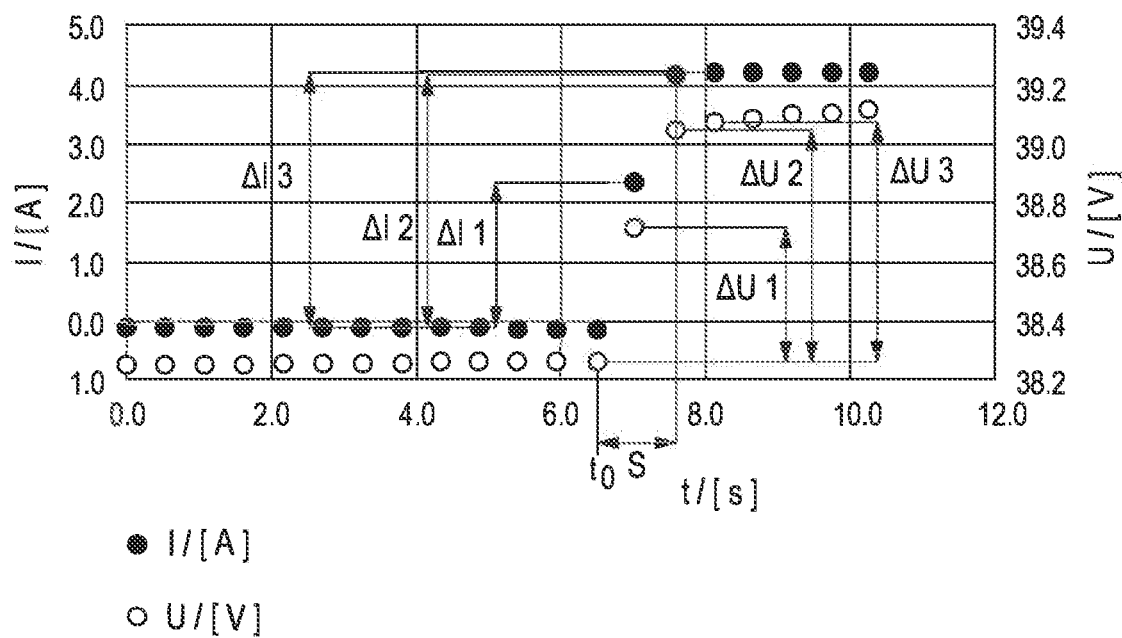
FIG. 8 is a diagram indicating the output voltage and load current of a traction battery as a function of time in the event of a step change type connection of a test load.

FIG. 8 shows the profiles of output voltage U and load current I, which reflects a step change in charging current, of an exemplary traction battery. The diagram of FIG. 8 in each case shows the measured values for U and I at a respective point in time t. The origin of the time scale is arbitrarily chosen. At a step change time $t_0$ at approximately t=6.5 s, a test load in the form of a charging current is connected, such that the output voltage U and the charging current as load current I change abruptly as a step change S. This period extends approximately between t=6.5 s and t=7.5 s. Thereafter, U and I change only very slowly. A description function of U and I can be identified by using a regression function, for example an exponential function. If a time offset $t_{offset}$ is provided in this regression function, the coefficient of determination $R^2$ can be maximised by shifting the time base by modifying $t_{offset}$ and the activation time $t_0$ of the step change S thus established, as shown for example in FIG. 14 for various values of $t_{offset}$.

Figure 9:
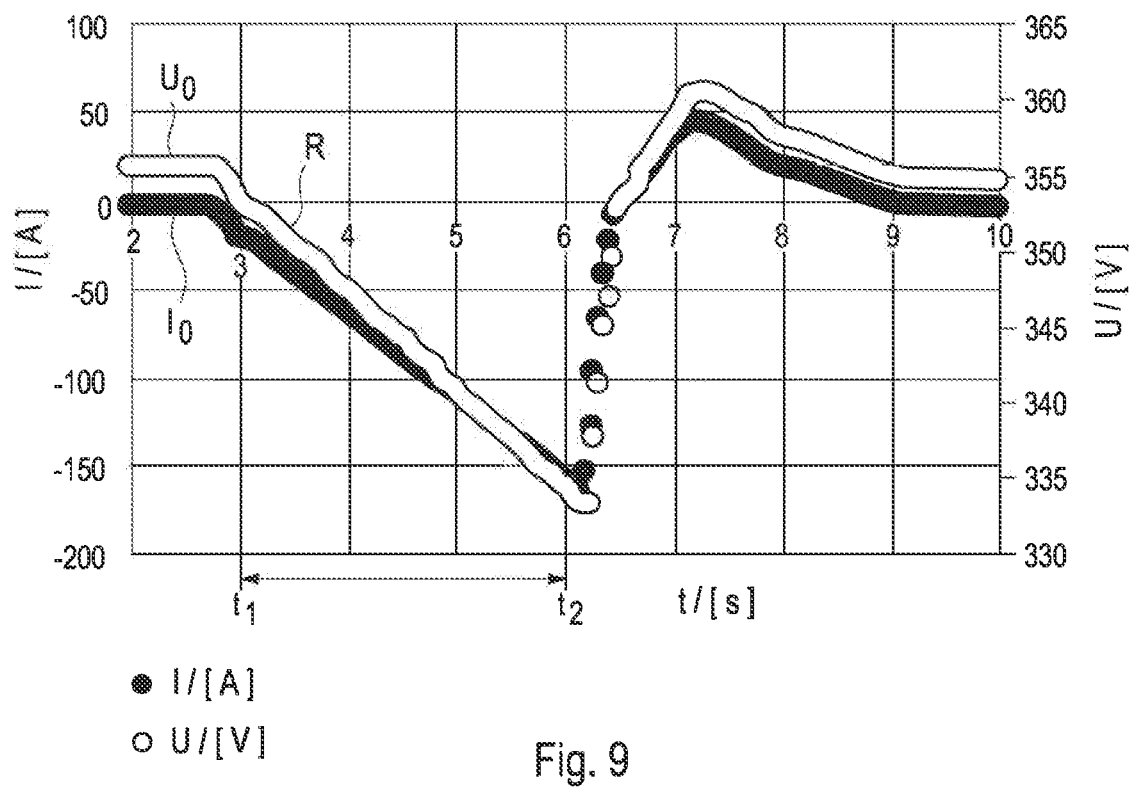
FIG. 9 is a diagram indicating the output voltage and load current of a traction battery as a function of time in the event of a ramped connection of a test load.

FIG. 9 shows a profile of output voltage U and load current of a traction battery as a function of time with ramped connection R of a test load, which in this case is a discharging current. Over the period $t_1=3$ s to $t_2=6$ s the discharging current I gradually declines, and after termination of the load, the current I and voltage U swing back towards closed-circuit current $I_0$ and open-circuit voltage $U_0$. Establishment of the internal resistance is improved by preferably taking account of the measured values within the time interval $t_1$ to $t_2$ of the load period of the ramped connection R, which can be approximated by means of a regression line, wherein the internal resistance $R_i$ can be exactly determined from the regression line. In order to be able to determine this time period exactly, a regression function of the load current I can be assumed which corresponds to the test load function and the time period $t_i$ to $t_2$ can be precisely determined by consideration of a maximisation profile of the coefficient of determination $R^2$.

Corresponding internal resistance values can be established from the measured value pairs established at a given point in time. Some of these internal resistance values $R_i$ are plotted against time t in the diagram of FIG. 10, wherein the internal resistance values $R_i1$ to $R_i3$ established during the step change are marked accordingly. The dotted line shown in FIG. 10 is a best fit line of the measured internal resistance values $R_i$.

Figure 10:
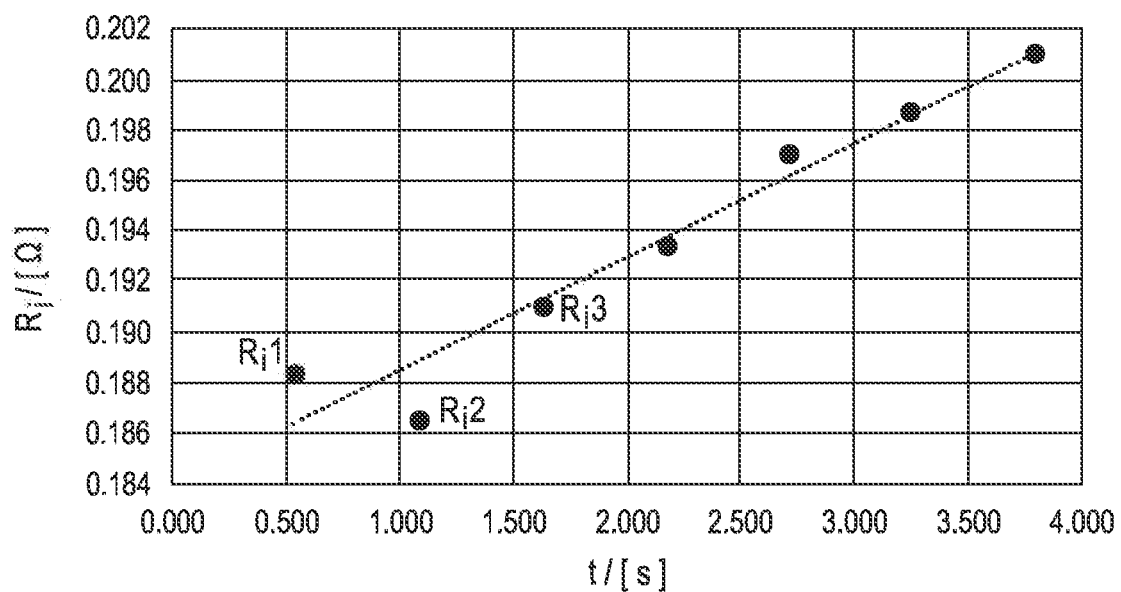
FIGS. 10 & 11 are various diagrams indicating the internal resistance of a traction battery as a function of time for various, partially processed measured values.

It is clear from FIG. 10 and also from FIG. 11a that in particular the measured values $R_i1$ and $R_i2$ deviate considerably from the best fit lines, so emphasising the need for frequent plausibility checking. This is also indicated by the minimised value of the coefficient of determination $R^2$. To determine the internal resistance of a traction battery, the system response of the traction battery to a system excitation is evaluated in general terms. A current is imposed as the system excitation, while the system response is the voltage change across the battery terminals.

Under real-world conditions, the current and voltage difference during an acceleration process is used to calculate the internal resistance $R_i$. With the values $U_0$, $I_0$ in a system resting state, i.e. an open-circuit voltage $U_0$ and a closed-circuit current $I_0$, and the values $U_i$, $I_i$ at a point in time $t_i$, the internal resistance $R_i$ is calculated according to the equation:

$$R_i = \frac{U_i - U_0}{I_i - I_0}.$$

Instead of accelerating the vehicle with a drive motor, another energy-intensive consumer can be activated. Battery charging can in principle be provided as system excitation.

Figure 1:
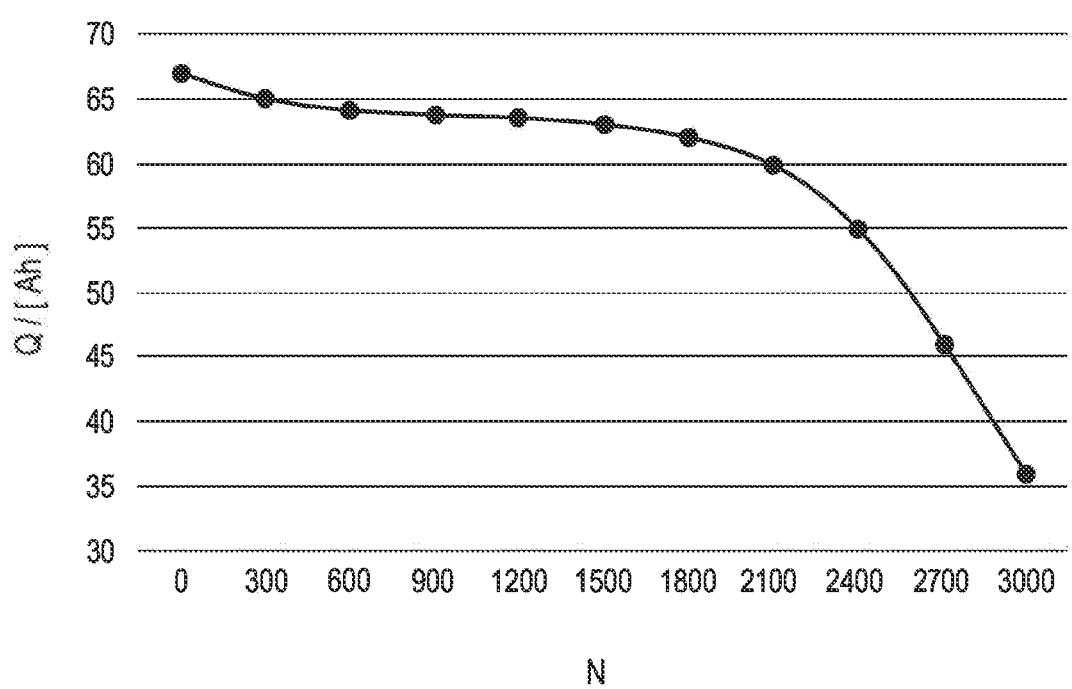
FIG. 1 is a diagram indicating the storage capacity Q of a traction battery as a function of the number of ageing cycles N.
Figure 2:
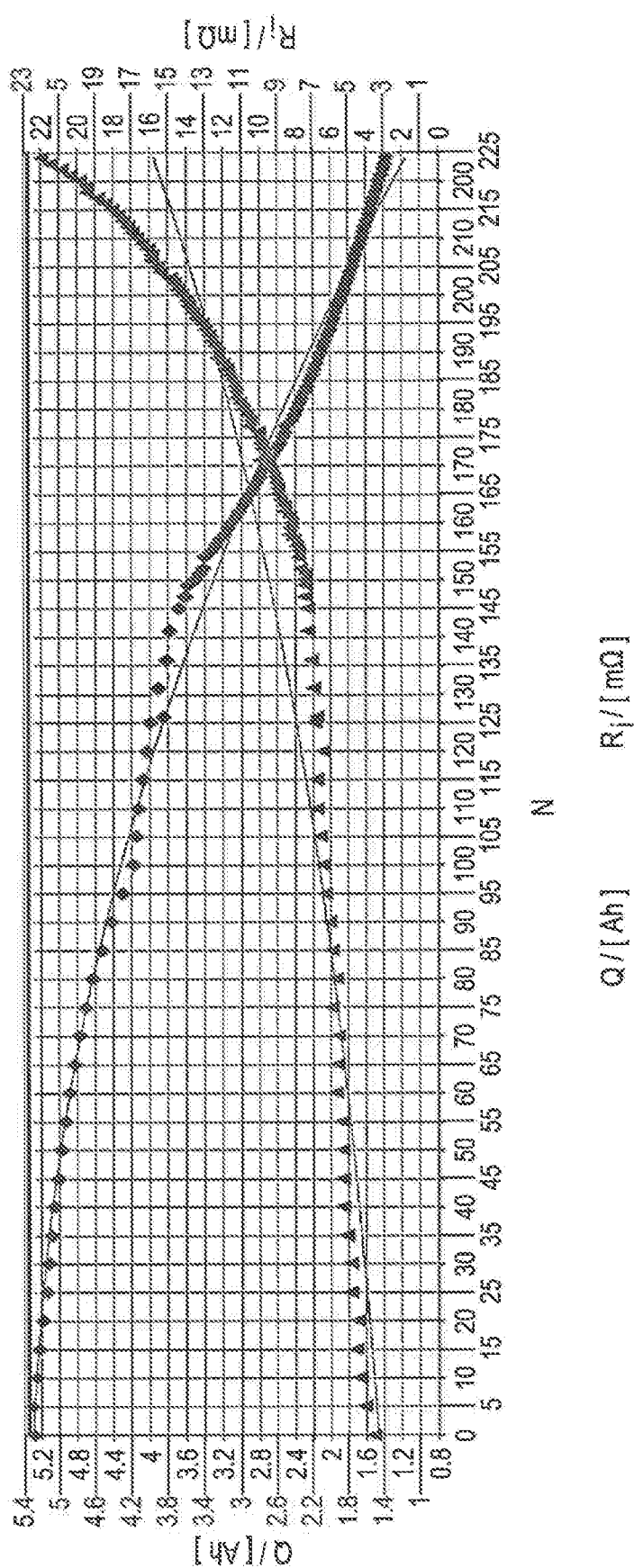
FIG. 2 is a diagram indicating the capacity Q and the internal resistance $R_i$ of a traction battery as a function of the number of ageing cycles N.
Figure 3:
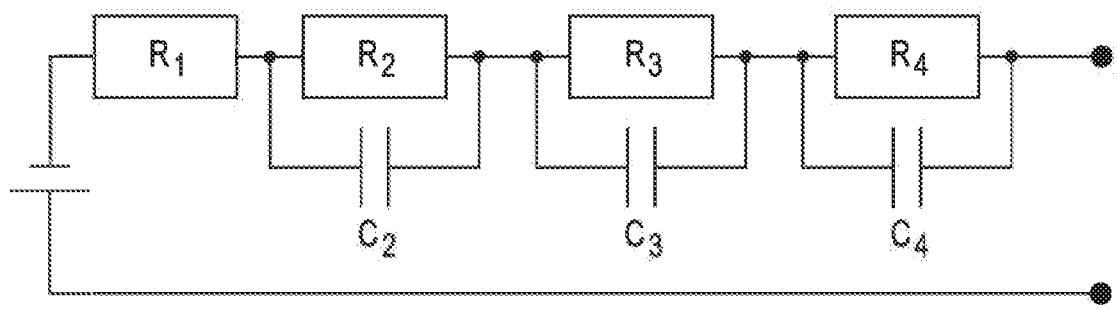
FIG. 3 is an equivalent circuit diagram of a battery cell or a traction battery.

It is often not possible to synchronise the time scale of the system excitation, i.e. connection of the test load or of the charging current, with the time scale of the system response, i.e. the acquisition of the measured values. However, in order to reliably determine the real part of the internal resistance, i.e. the resistance $R_1$ in the equivalent circuit diagram of FIG. 3, it is necessary to determine the internal resistance directly after activating the test load, or at a defined point in time in the near future. Due to the large rate of change in current and voltage, the corresponding measured value pairs at this moment are often subject to major error or are not established at the correct time due to the discrete sampling. To ensure that $R_1$ is correctly established, measurement data are therefore preferably interpolated or extrapolated. Suitable interpretation of the measurement data is therefore essential.

Figure 11:
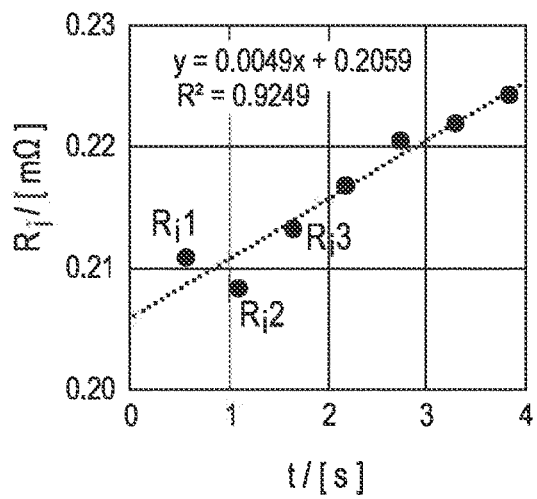
Figure 11:
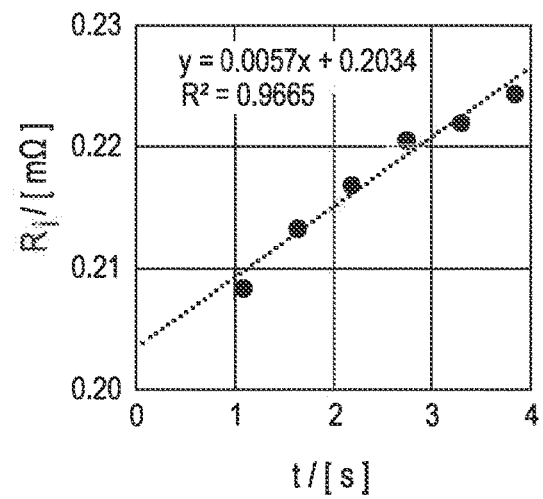
Figure 11:
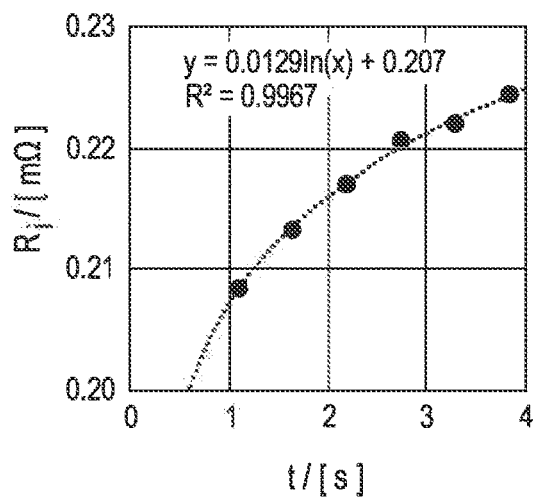
Figure 11:
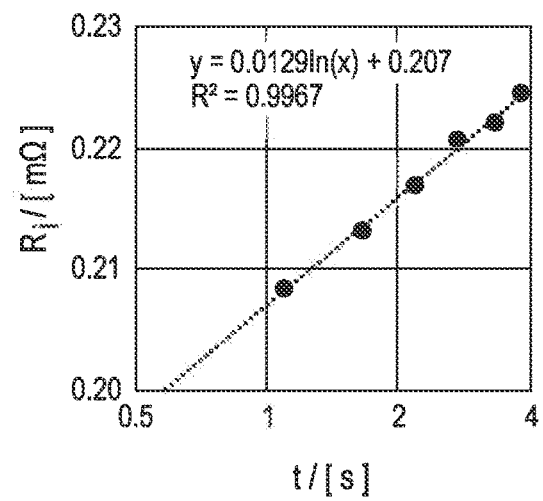

One approach to evaluating the measurement data is explained with reference to FIG. 11, wherein internal resistance $R_i$ is plotted against time tin each of FIGS. 11a to 11d. The dots represent the respective measured values, while the corresponding compensation function together with the associated coefficient of determination $R^2$ is indicated in the diagram.

FIG. 11a substantially corresponds to FIG. 10, and shows a relatively low coefficient of determination $R^2$, i.e. a relatively inaccurate determination of the internal resistance profile.

In contrast with FIG. 11a, in FIG. 11b the measured value $R_i1$ is discarded due to its major deviation from the best fit lines or a specified expected value. A comparison with FIG. 11a reveals that the gradient of the compensation function of FIG. 11b has increased somewhat and the value of the coefficient of determination $R^2$ has improved from 0.9249 (FIG. 11a) to 0.9665 (FIG. 11b).

The diagram shown in FIG. 11c used the same measured values as in FIG. 11b, wherein, however, a logarithmic compensation function was used instead of the linear compensation function used for FIG. 11a and. Another distinct improvement in the value of $R^2$ to 0.9967 is obtained here.

FIG. 11d corresponds to FIG. 11c, wherein the time axis (x axis) has been logarithmically scaled.

Figure 12:
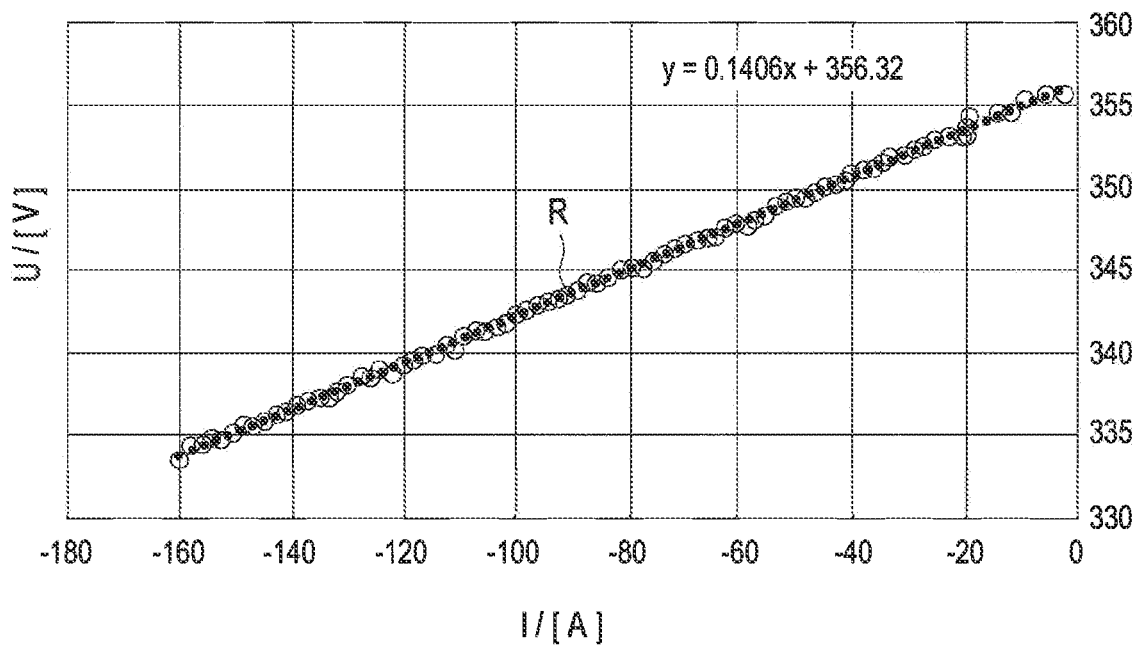
FIG. 12 is a diagram of a current-voltage profile I/U of a traction battery with internal resistance $R_i$ established by means of a least square regression line.
Figure 13:
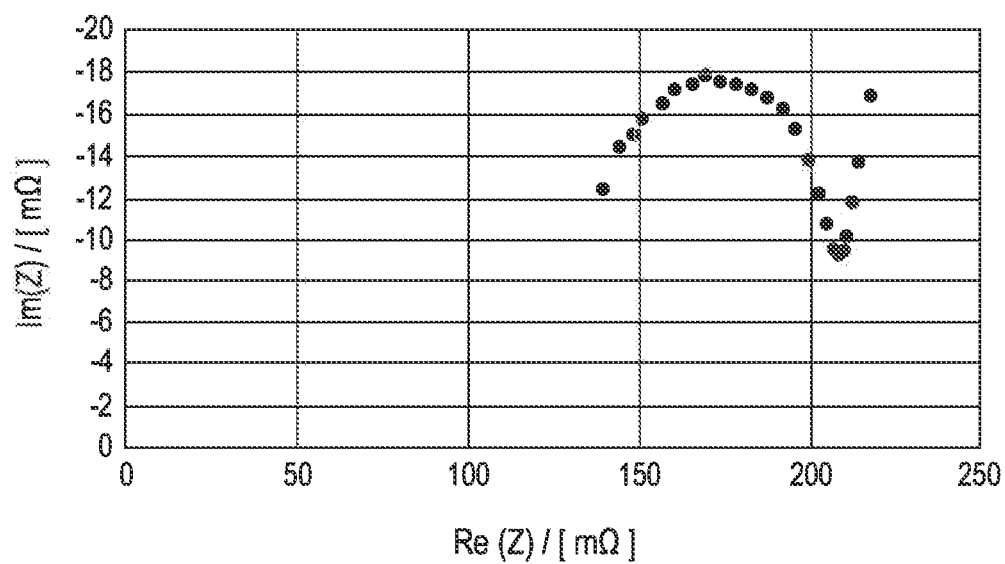
FIG. 13 is a diagram indicating the real part Re(Z) and the imaginary part Im(Z) of a complex internal resistance Z of a traction battery for various frequencies.

FIG. 12 shows a diagram of a linear current and voltage profile I/U of a traction battery with a ramped load R. The internal resistance $R_i$, is established using adjustment cal-culus tools to determine a regression line by means of a least squares approach, i.e. the least square fit method. The coefficient of determination $R^2$ which can be established indicates whether the considered compensation function, in this case a curve, fits the established measured values. The method is outstandingly suitable even for establishing an open-circuit voltage $U_0$ with a fluctuating current.

This demonstrated that the profile of the measurement sequence can be modelled very accurately by adjusting the measurement sequence by means of a mathematical adjustment calculus using a logarithmic function. The logarithmic function established in this manner can then be used to extrapolate or interpolate the ohmic internal resistance at a desired point in time, in particular a point in time close to the onset of the step change response.

A further significant improvement in data evaluation can be achieved when establishing the ohmic internal resistance by not taking account of those value pairs in which a difference between the expected load current and the acquired load current exceeds a predetermined tolerance value, as was done in the present example for the value pair on which internal resistance $R_i1$ was based.

Further methods for improving the accuracy of internal resistance determination and thus the accuracy in determining the state value are briefly described below:

1. Internal resistance can be determined in a plurality of passes, wherein in each pass the test load is connected and removed again at the end of the pass. At least one value pair, preferably a measurement sequence, is acquired in each pass. A respective ohmic internal resistance of the traction battery is then established for each pass. Finally, an average for the ohmic internal resistance is established from the ohmic internal resistances established in a plurality of passes. This average is then used to establish the state value of the traction battery.

2. For at least one value of a value pair, a respective valid measurement range is defined, wherein a value pair is not taken into account if one or both values are outside the respective measurement range, wherein the measurement range is preferably defined on the basis of an absolute value or a rate of change of the associated value.

This can be done by defining corresponding valid measurement ranges for identifying the erroneous measured values. The measurement ranges may be defined absolutely, for example by absolute limit values for voltage, or relatively, for example by a boundary for a rate of change in voltage. Subsequently, all the measured value pairs are verified as to whether their values are within the previously defined measurement range and are screened out if they do not fall within the defined measuring ranges. This can be done, for example, by analysing the coefficient of determination $R^2$ of the values in the step change range by establishing the change in $R^2$ brought about by omitting the measured value.

3. A measurement sequence of output voltage and load current value pairs is acquired, wherein the test load is connected throughout the duration of the measurement sequence, wherein the measurement sequence comprises a plurality of output voltage and load current value pairs acquired at a rapid succession of points in time. A value pair is not taken into account if one or both values of this pair are equal to the corresponding value of at least one value pair acquired at a previous point in time.

This method makes it possible to eliminate "stuck" measured values which in particular arise due to transmission errors and in particular delays during data transmission from the traction battery or OBD. These data can lead to errors in the evaluation result, which are difficult or impossible to identify in retrospect. Such "stuck measured values" can, however, be screened out on the basis of firm criteria, since these erroneous data are above all characterised by the measured values not changing over a certain period of time. Due to the characteristic feature of the method according to the invention, according to which a system response to an abrupt system excitation is to be identified, any measured values which do not differ from the previous measured value can be screened out. If, for example, at least one value, i.e. voltage or current, does not change within a measurement sequence from one measured value pair to the next, the respective value pair acquired at the later point in time can be deleted from the data set to be evaluated. If, however, the error of a stuck measured value relates to just one value of a value pair, said value can also be replaced by interpolation from the other corresponding values.

4. A measurement sequence of output voltage and load current value pairs is acquired, wherein the test load is connected throughout the duration of the measurement sequence. The measurement sequence comprises a plurality of output voltage and load current value pairs acquired at a rapid succession of points in time. The measurement sequence is subjected to low-pass filtering. Surprisingly good improvements in the accuracy of the determination of the internal resistance can often be achieved with such simple filtering.

Low-pass filtering is particularly useful when it is not possible repeatedly to perform a plurality of measurement passes (see method 1.). The low-pass filter can be used as if a plurality of repeated measurements had been performed at a similar point in time, but taking account of the insufficient measurement resolution and thus forming a virtual average. This method can preferably be used for test arrangements which do not include step changes but are instead continuous.

5. Here too, a measurement sequence of output voltage and load current value pairs is acquired, wherein the test load is connected throughout the duration of the measurement sequence. Here too, the measurement sequence comprises a plurality of output voltage and load current value pairs acquired at a rapid succession of points in time.

a) A moving average value of the ohmic internal resistance is established from the output voltage and load current value pairs of the measurement sequence. This method is particularly suitable for ramped excitation, i.e. a continuous load increase or decrease. This preferably proceeds in that the respective ohmic internal resistance for two respective value pairs acquired in immediate succession is established from the difference of the two output voltages divided by the difference of the two load currents and the moving average of the ohmic internal resistance is formed by the average of the respective ohmic resistances established in this manner. Accordingly, the associated internal resistance is established in each case from two adjacent value pairs of the measurement sequence and then an average of these internal resistance values is calculated according to the following equation:

$$R_i = \frac{\sum_{m=1}^{n-1} R_{im}}{n-1},$$

1. wherein n is the number of value pairs, and a respective ohmic resistance $R_{im}$ is established from two value pairs acquired in immediate succession according to the equation $$R_{im} = \frac{U_{m+1} - U_m}{I_{m+1} - I_m},$$

2. wherein $U_m$, $U_{m+1}$ are the respective output voltages and $I_m$, $I_{m+1}$ the respective load currents of two value pairs m, m+1 acquired in immediate succession of the measurement sequence. If, instead of $U_m$ and $I_m$, the open-circuit voltage $U_0$ and the closed-circuit current $I_0$ are selected, this method can also be used for step change type excitations.

3. The number n need not necessarily represent the number of all measured value pairs of the measurement sequence, but can also be a number of measured value pairs to be taken into account, e.g. if one or more measured value pairs have been removed from the measurement sequence or are not to be taken into account.

b) Alternatively to method 5a), the ohmic internal resistance can be established from the respective output voltage and load current value pairs on the basis of a mathematical adjustment calculus, preferably according to the least square fit method. This approach has already been described above with reference to FIGS. 8 to 14.

In the absence of the above-described methods for improving accuracy in determining internal resistance and determining the state value, a distinctly greater scatter of the result data could be observed. Variance of up to some 20% of the internal resistance was established over a series of various test passes. Applying the stated methods made it possible to reduce it to as low as 3% or even less.

If the time response of the battery is known as a function of battery type, age, state of charge, temperature and optionally other parameters, the switching time $t_0$ at which current function starts can be determined relatively precisely using the comparison curve established for a reference battery.

Figure 14:
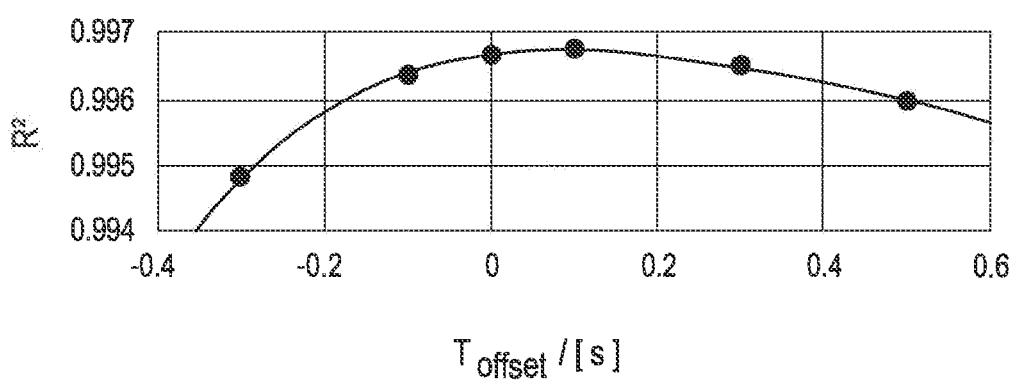
FIG. 14 is a diagram indicating a coefficient of determination $R^2$ for an established internal resistance of a traction battery as a function of variation in the point in time $t_{offset}$ for connection of a test load.

If this is not possible, time $t_0$ can be varied when establishing the compensation function. The switching time $t_0$ can then be estimated by maximising the coefficient of determination $R^2$ of the compensation function. FIG. 14 shows a diagram in which the coefficient of determination $R^2$ is plotted against the variation or change of the switching time $t_0$, implicitly a time offset $t_{offset}$.

LIST OF REFERENCE SIGNS

10, 110 Diagnostics device
12 Establishing module
14 Normalisation module
16 Log printout
18 Buffer module
20 Electric vehicle

The invention claimed is:

1. A method for determining a state of health (SoH) value of a traction battery of an electric vehicle, which characterizes the ageing state of the traction battery, comprising:

loading the traction battery by a test load being an evaluation run of the electric vehicle;

at at least one point in time, acquiring a respective output voltage and load current value pair of the traction battery;

establishing an ohmic internal resistance of the traction battery on the basis of the acquired output voltage and load current value pair;

establishing the state of health value of the traction battery on the basis of the established ohmic internal resistance;

establishing at least one normalisation variable which characterises the traction battery;

on the basis of the established ohmic internal resistance and the at least one normalisation variable, establishing a normalised internal resistance based on a reference value of the normalisation variable;

wherein the state of health value of the traction battery is established on the basis of the normalised internal resistance;

wherein the test load proceeds in a such a way that, on connection of the test load at an activation time, the load current has a step change in current or a ramped profile;

wherein a measurement sequence of output voltage and load current value pairs is acquired starting before or with the connection of the test load at an activation time;

wherein the measurement sequence comprises a plurality of output voltage and load current value pairs acquired at a succeeding points in time;

wherein parameters of a compensation function, which models a profile of the measurement sequence, are established for the determination of the internal resistance by means of a mathematical adjustment calculus;

wherein an optimization calculation of the compensation function is carried out in such a way that a coefficient of determination which describes a goodness of fit of the adjustment calculus, is maximized to determine the activation time of the test load.

2. The method according to claim 1, wherein:
the load current is generated during an evaluation run of the electric vehicle; and
the test load is formed by accelerating a drive motor of the electric vehicle.

3. The method according to claim 1, wherein:
a first normalisation variable is a temperature of the traction battery during acquisition of the output voltage and load current values; and
the reference value of the first normalisation variable is a reference temperature.

4. The method according to claim 3, wherein:
a second normalisation variable characterises a type of traction battery;
the reference value of the second normalisation variable is a normalisation factor which relates different types of traction batteries to one another; and
the normalisation factor is specified on a basis of at least one battery type parameter.

5. The method according to claim 1, wherein:
the state of health value is established on a basis of the normalised internal resistance using a mathematical model or a table, preferably a lookup table or a performance map; and
parameters or values which describe the mathematical model or the table are retrieved from a database.

6. The method according to claim 1, wherein:
an expected load current is predetermined by the test load, and by the output voltage of the traction battery; and
those value pairs in which a difference between the expected load current and the acquired load current exceeds a predetermined tolerance value are not taken into account for establishing the ohmic internal resistance of the traction battery.

7. The method according to claim 1, wherein:
the at least one output voltage and load current value pair of the traction battery is acquired in a plurality of passes, wherein in each pass the test load is connected and removed again at an end of the pass;
at at least one point in time of a pass a respective value pair is acquired and a respective ohmic internal resistance of the traction battery is established on a basis of the acquired value pair;
an average value for the ohmic internal resistance is established from respective ohmic internal resistances established in the plurality of passes; and
the state of health value of the traction battery is established on the basis of the average of the ohmic internal resistance.

8. The method according to claim 1, wherein establishing the ohmic internal resistance of the traction battery furthermore comprises at least one of the following steps:
for at least one value of a value pair, a respective valid measurement range is defined, wherein a value pair is not taken into account if one or both values are outside the respective measurement range, wherein the measurement range is defined on the basis of an absolute value or a rate of change of the associated value;
a measurement sequence of output voltage and load current value pairs is acquired, wherein the test load is connected throughout the duration of the measurement sequence, wherein the measurement sequence comprises a plurality of output voltage and load current value pairs acquired at succeeding points in time, wherein a value pair is not taken into account if one or both values of this pair are equal to the corresponding value of at least one value pair acquired at a previous point in time;
a measurement sequence of output voltage and load current value pairs is acquired, wherein the test load is connected throughout the duration of the measurement sequence, wherein the measurement sequence comprises a plurality of output voltage and load current value pairs acquired at succeeding points in time, wherein the measurement sequence is subjected to low-pass filtering; or
a measurement sequence of output voltage and load current value pairs is acquired, wherein the test load is connected throughout the duration of the measurement sequence, wherein the measurement sequence comprises a plurality of output voltage and load current value pairs acquired at succeeding points in time, wherein;
a moving average value of the ohmic internal resistance is established from the output voltage and load current value pairs of the measurement sequence, wherein the respective ohmic internal resistance for two respective value pairs acquired in immediate succession is established from the difference of the two output voltages divided by the difference of the two load currents and the moving average of the ohmic internal resistance is formed by the average of the respective ohmic resistances established in this manner, or the ohmic internal resistance is established from the respective output voltage and load current value pairs on the basis of a mathematical adjustment calculus, according to the least square fit method.

9. A method for determining a state of health (SoH) value of a traction battery of an electric vehicle, which characterizes the ageing state of the traction battery, comprising:

loading the traction battery by a test load;

at at least one point in time, acquiring a respective output voltage and load current value pair of the traction battery;

establishing an ohmic internal resistance of the traction battery on the basis of the acquired output voltage and load current value pair;

establishing the state of health value of the traction battery on the basis of the established ohmic internal resistance;

establishing at least one normalisation variable which characterizes the traction battery;

on the basis of the established ohmic internal resistance and the at least one normalisation variable, establishing a normalised internal resistance based on a reference value of the normalisation variable;

wherein the state of health value of the traction battery is established on the basis of the normalised internal resistance;

wherein the test load proceeds in a such a way that, on connection of the test load, the load current has a step change in current or a ramped profile;

wherein a measurement sequence of output voltage and load current value pairs is acquired starting with the connection of the test load;

wherein the measurement sequence comprises a plurality of output voltage and load current value pairs acquired at succeeding points in time;

wherein parameters of a compensation function, which models a profile of the measurement sequence, are established for the determination of the internal resistance by means of a mathematical adjustment calculus;

wherein an optimization calculation of the compensation function is carried out in such a way that a coefficient of determination which describes a goodness of fit of the adjustment calculus, is maximized, wherein:

a first normalisation variable is a temperature of the traction battery during acquisition of the output voltage and load current values; and the reference value of the first normalisation variable is a reference temperature;

the temperature of the traction battery is established in that;

in a first measurement step, a first ambient temperature and a first ohmic internal resistance of the traction battery are established at a first point in time;

in a second measurement step after a predetermined period of time has elapsed, a second ambient temperature and a second ohmic internal resistance of the traction battery is established at a second point in time;

on a basis of a difference of the first and second ohmic internal resistance and the specified period of time, a rate of change in internal resistance is established;

on a basis of the rate of change in internal resistance, a differential temperature between the ambient temperature and the temperature of the traction battery is established; and the temperature of the traction battery is established by addition of a reference ambient temperature established from the first and/or second ambient temperature and the established differential temperature.

10. The method according to claim 9, wherein the predetermined period of time is between 5 and 15 minutes.

11. The method according to claim 9, wherein the state of health value of the traction battery is established on the basis of the second ohmic internal resistance.

12. A method for determining a state of health (SoH) value of a traction battery of an electric vehicle, which characterizes the ageing state of the traction battery, comprising:

loading the traction battery by a test load;

at at least one point in time, acquiring a respective output voltage and load current value pair of the traction battery;

establishing an ohmic internal resistance of the traction battery on the basis of the acquired output voltage and load current value pair;

establishing the state of health value of the traction battery on the basis of the established ohmic internal resistance;

establishing at least one normalisation variable which characterizes the traction battery;

on the basis of the established ohmic internal resistance and the at least one normalisation variable, establishing a normalised internal resistance based on a reference value of the normalisation variable;

wherein the state of health value of the traction battery is established on the basis of the normalised internal resistance;

wherein the test load proceeds in a such a way that, on connection of the test load, the load current has a step change in current or a ramped profile;

wherein a measurement sequence of output voltage and load current value pairs is acquired starting with the connection of the test load;

wherein the measurement sequence comprises a plurality of output voltage and load current value pairs acquired at succeeding points in time;

wherein parameters of a compensation function, which models a profile of the measurement sequence, are established for the determination of the internal resistance by means of a mathematical adjustment calculus;

wherein an optimization calculation of the compensation function is carried out in such a way that a coefficient of determination which describes a goodness of fit of the adjustment calculus, is maximized, wherein:

at least one output voltage and load current reference value pair is additionally acquired before the test load is connected, on the basis of which an open-circuit voltage and a closed-circuit current are established;

the ohmic internal resistance for a respective value pair of the measurement sequence is established as a quotient of a difference of the acquired output voltage and the open-circuit voltage and a difference of the acquired load current and the closed-circuit current;

parameters of a logarithmic function, which models a profile of the measurement sequence, are established for the measurement sequence by means of a mathematical adjustment calculus; and on a basis of the logarithmic function, the ohmic internal resistance is established at the time of the step change in current, or at a corresponding frequency.

13. The method according to claim 12, wherein:
the logarithmic function is determined by the equation $$R_i(t_i) = a \cdot \ln(t_i + t_{offset}) + b,$$

wherein $t_i$ is the time elapsed since the load was connected, $R_i(t_i)$ is an interpolated internal resistance at time $t_i$, $t_{offset}$ the time between the actual activation time and the estimated activation time and a and b are parameters.

* * * * *